United States Patent
Shimabe et al.

(10) Patent No.: US 9,282,635 B2
(45) Date of Patent: Mar. 8, 2016

(54) MULTILAYER WIRING BOARD WITH BUILT-IN ELECTRONIC COMPONENT AND METHOD FOR MANUFACTURING THE SAME

(71) Applicant: IBIDEN CO., LTD., Ogaki-shi (JP)

(72) Inventors: Toyotaka Shimabe, Ogaki (JP); Shunsuke Sakai, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/669,329

(22) Filed: Mar. 26, 2015

(65) Prior Publication Data
US 2015/0282305 A1    Oct. 1, 2015

(30) Foreign Application Priority Data

Mar. 26, 2014  (JP) .................................. 2014-064074

(51) Int. Cl.
| | |
|---|---|
| H05K 7/00 | (2006.01) |
| H05K 1/02 | (2006.01) |
| H05K 1/18 | (2006.01) |
| H05K 3/46 | (2006.01) |

(52) U.S. Cl.
CPC .............. *H05K 1/0284* (2013.01); *H05K 1/185* (2013.01); *H05K 3/4697* (2013.01); *H05K 2201/0344* (2013.01); *H05K 2201/09036* (2013.01); *H05K 2201/10015* (2013.01); *H05K 2201/10522* (2013.01); *Y10T 29/4913* (2015.01)

(58) Field of Classification Search
USPC .................................. 361/760, 748, 807, 761
See application file for complete search history.

(56) References Cited

U.S. PATENT DOCUMENTS

| 2010/0300738 | A1  | 12/2010 | Ito et al. |
| 2011/0240354 | A1* | 10/2011 | Furuhata ............... H01L 21/568 174/258 |
| 2012/0188734 | A1* | 7/2012 | Mikado .................. H05K 1/185 361/761 |

FOREIGN PATENT DOCUMENTS

JP        2012-109610 A    6/2012

OTHER PUBLICATIONS

U.S. Appl. No. 12/626,085, filed Feb. 19, 2015, Shimabe et al.

* cited by examiner

*Primary Examiner* — Andargie M Aychillhum
(74) *Attorney, Agent, or Firm* — Oblon, McClelland, Maier & Neustadt, L.L.P.

(57) ABSTRACT

A multilayer wiring board with a built-in electronic component includes a substrate, a conductor layer formed on surface of the substrate, one or more electronic components positioned in a cavity formed through the substrate, an insulating layer formed on the substrate such that the insulating layer is formed on the component in the cavity, and a wiring layer formed on the insulating layer. The conductor layer has an opening formed such that the cavity is formed in the opening of the conductor layer and that the conductor layer has a first side in the opening and a second side in the opening on the opposite side across the cavity, and the cavity is formed in the opening of the conductor layer such that width between the cavity and the first side of the conductor layer is greater than width between the cavity and the second side of the conductor layer.

13 Claims, 18 Drawing Sheets

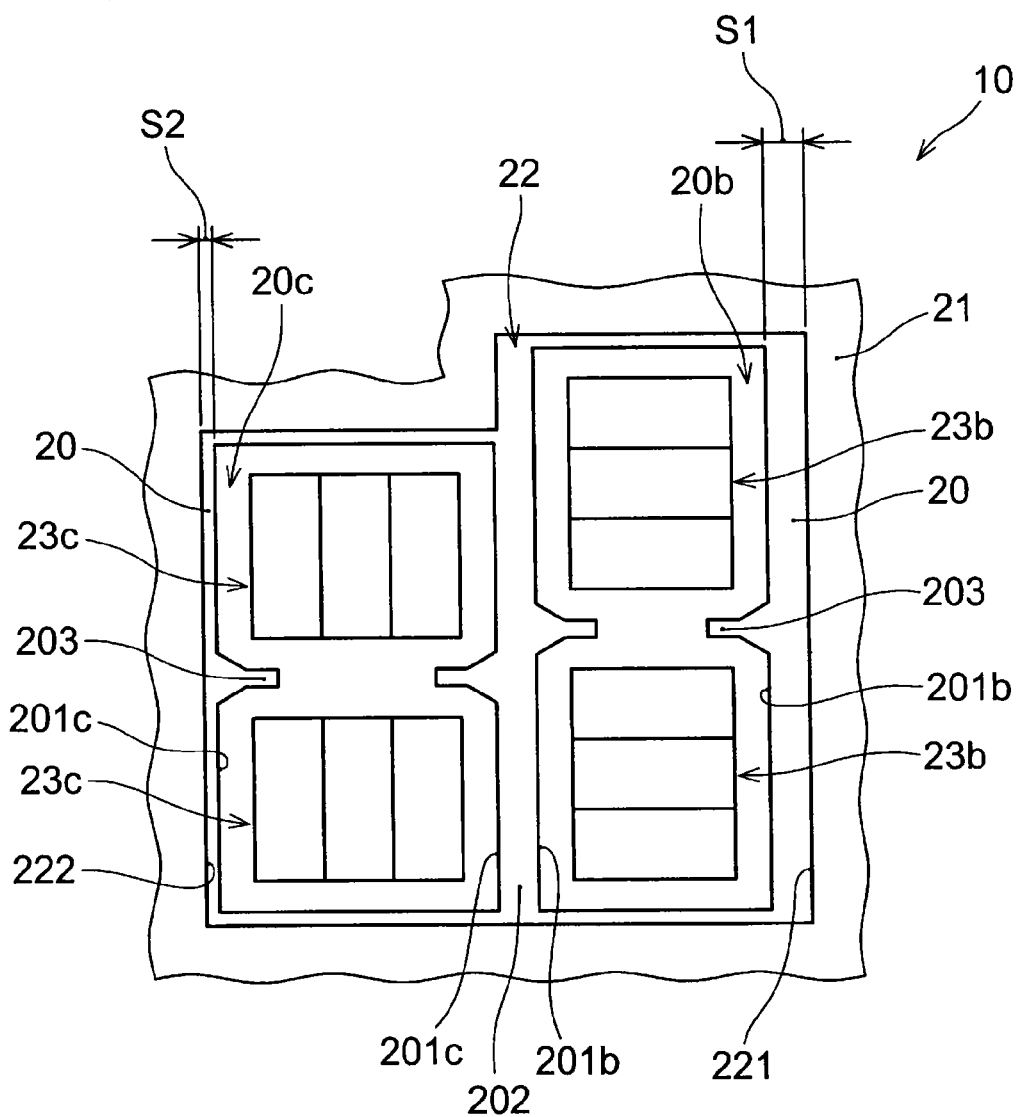

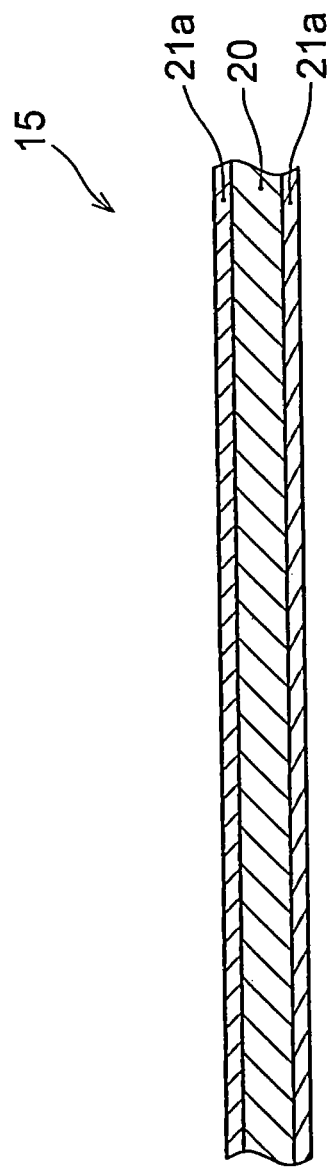

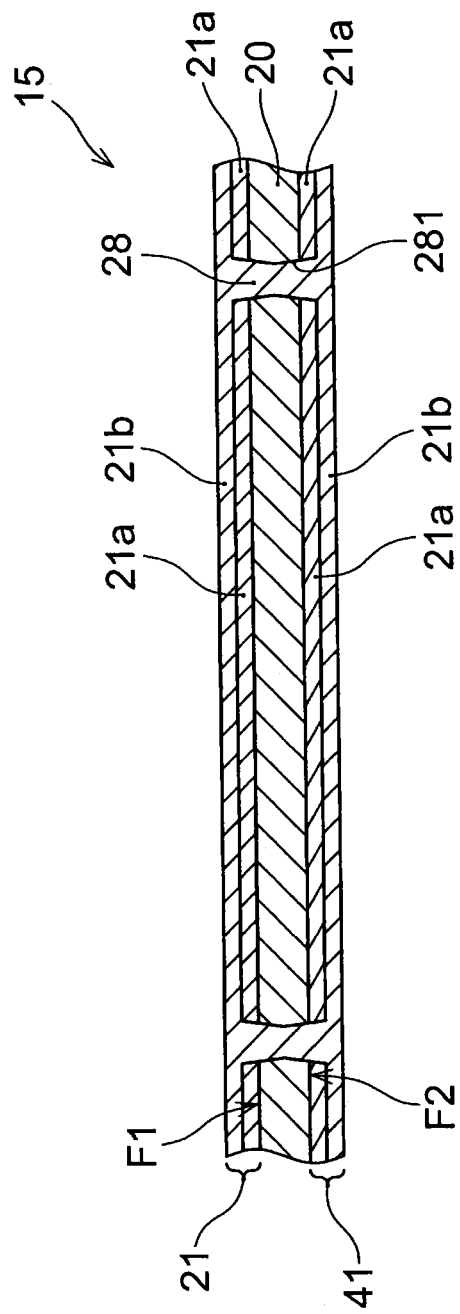

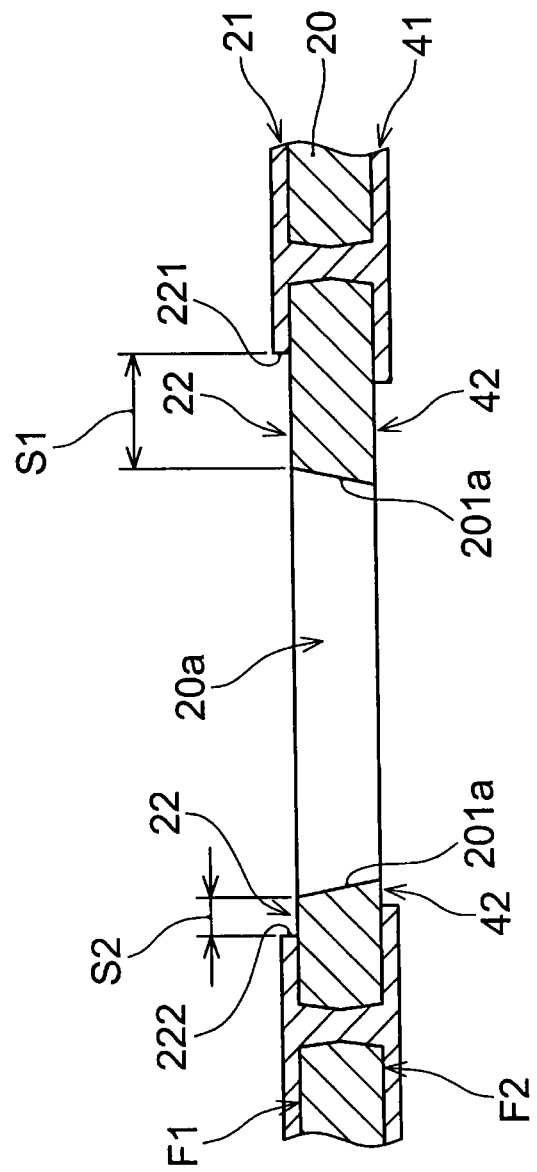

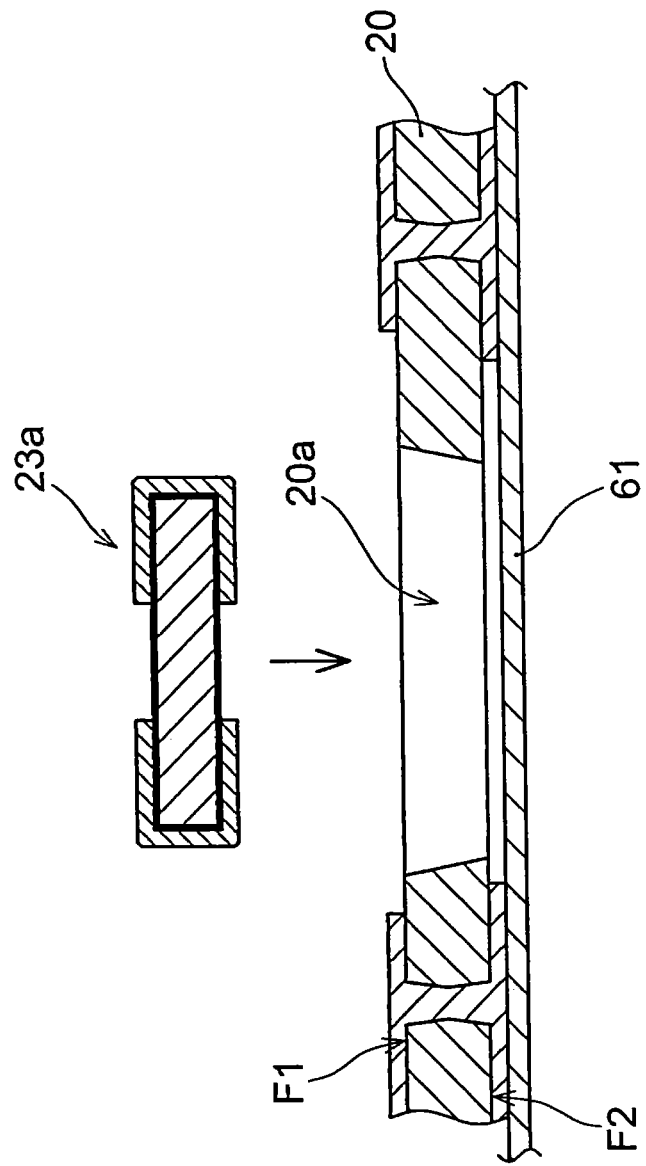

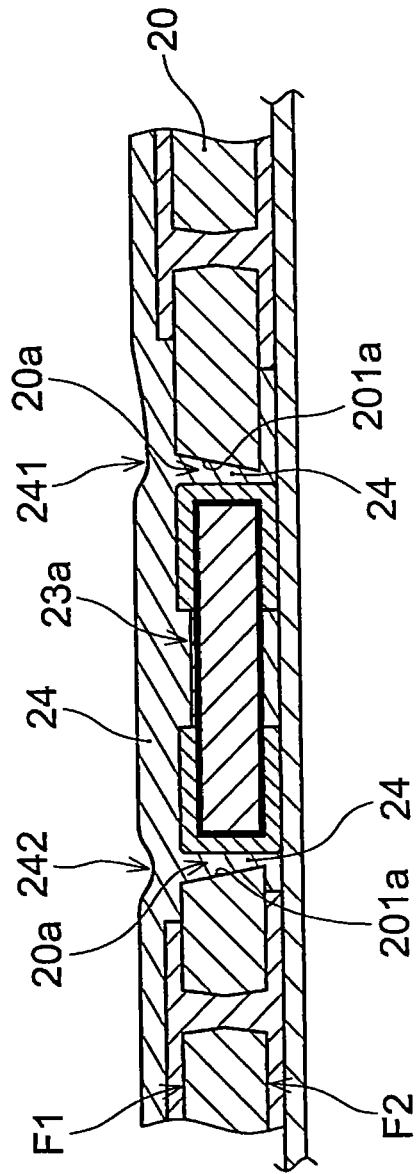

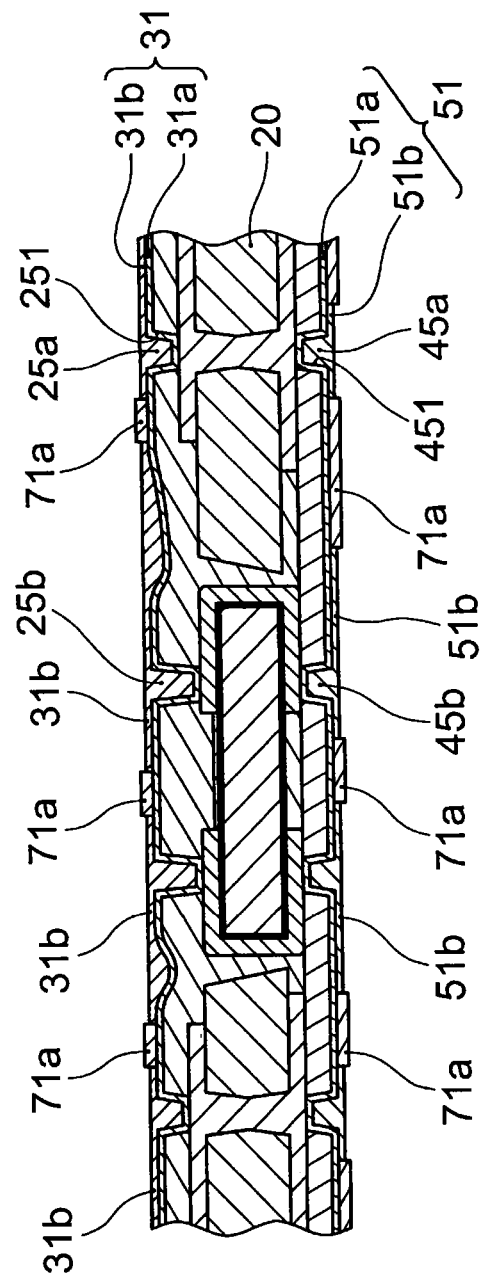

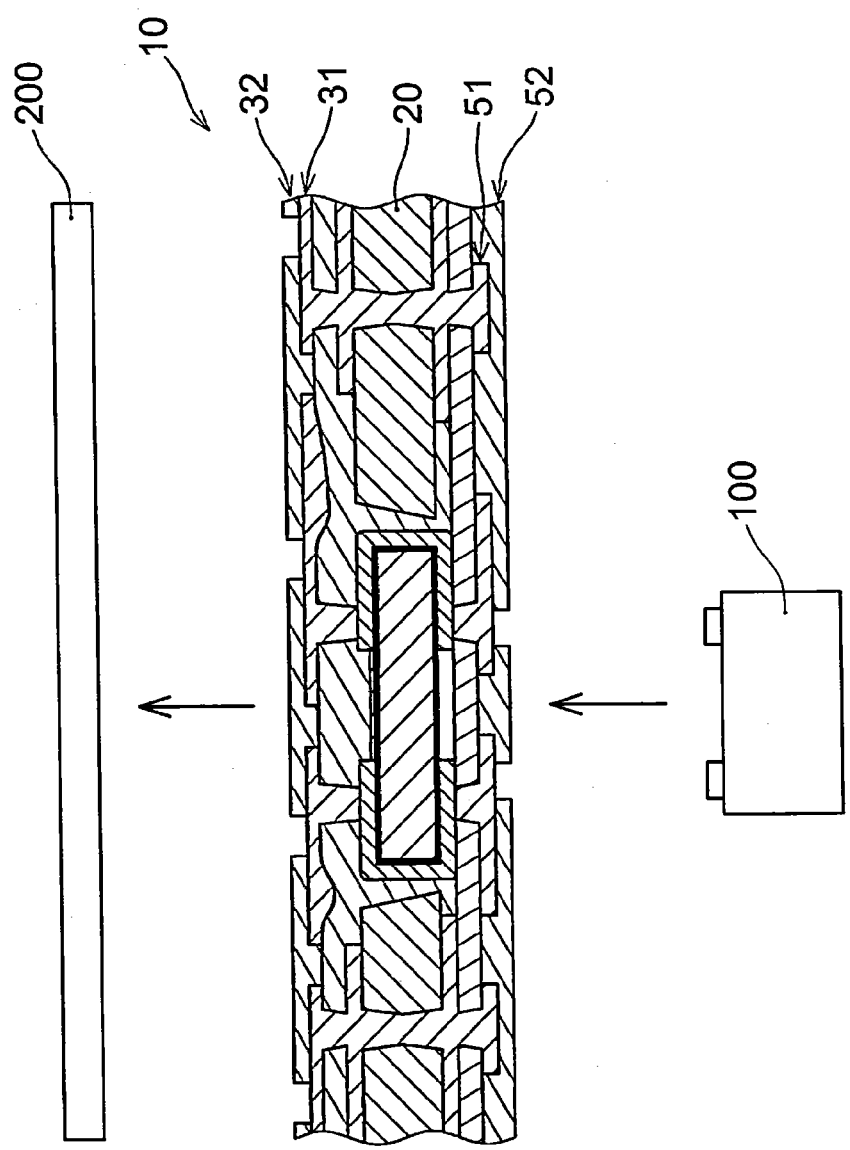

MULTILAYER WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-064074, filed Mar. 26, 2014, the entire contents of which are incorporated herein by reference.

BACKGROUND OF THE INVENTION

1. Field of the Invention

The present invention relates to a multilayer wiring board with a built-in electronic component and a method for manufacturing the same.

2. Description of Background Art

Japanese Patent Laid-Open Publication No. 2012-109610 describes a wiring board with a built-in electronic component, which includes a wiring board that has a conductor layer provided on each of both sides thereof and has a through hole provided in a region where a portion of the conductor layer is removed, an electronic component that is built in the through hole, an insulating layer that is formed around the electronic component in the through hole, on upper and lower surfaces of the electronic component and on upper and lower surfaces of the wiring board, and a wiring layer that is formed on the insulating layer. The entire contents of this publication are incorporated herein by reference.

SUMMARY OF THE INVENTION

According to one aspect of the present invention, a multilayer wiring board with a built-in electronic component includes a substrate, a conductor layer formed on a surface of the substrate, one or more electronic components positioned in a cavity formed through the substrate, an insulating layer formed on the substrate such that the insulating layer is formed on the electronic component or components in the cavity of the substrate, and a wiring layer formed on the insulating layer. The conductor layer has an opening portion formed such that the cavity of the substrate is formed in the opening portion of the conductor layer and that the conductor layer has a first side in the opening portion and a second side in the opening portion on the opposite side across the cavity with respect to the first side, and the cavity is formed in the opening portion of the conductor layer such that a width between the cavity and the first side of the conductor layer is greater than a width between the cavity and the second side of the conductor layer.

According to another aspect of the present invention, a method for manufacturing a multilayer wiring board with a built-in electronic component includes forming a conductor layer on a surface of a substrate, removing a portion of the conductor layer from the surface of the substrate such that an opening portion exposing a portion of the surface of the substrate is formed, forming a cavity through the substrate in the opening portion of the conductor layer such that the conductor layer has a first side in the opening portion and a second side in the opening portion on the opposite side across the cavity with respect to the first side and that a width between the cavity and the first side of the conductor layer is greater than a width between the cavity and the second side of the conductor layer, positioning one or more electronic components in the cavity formed in the substrate, forming an insulating layer on the substrate such that the insulating layer is formed on the electronic component or components in the cavity of the substrate, and forming a wiring layer on the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3C illustrates a plan view of yet another modified embodiment of the multilayer wiring board with a built-in electronic component illustrated in FIG. 1;

FIG. 5A illustrates an explanatory diagram of a process of the method for manufacturing the multilayer wiring board with a built-in electronic component illustrated in FIG. 1;

FIG. 5B illustrates an explanatory diagram of a process of the method for manufacturing the multilayer wiring board with a built-in electronic component illustrated in FIG. 1;

FIG. 5E illustrates an explanatory diagram of a process of the method for manufacturing the multilayer wiring board with a built-in electronic component illustrated in FIG. 1;

FIG. 5F illustrates an explanatory diagram of a process of the method for manufacturing the multilayer wiring board with a built-in electronic component illustrated in FIG. 1;

FIG. 5G illustrates an explanatory diagram of a process of the method for manufacturing the multilayer wiring board with a built-in electronic component illustrated in FIG. 1;

FIG. 5J illustrates an explanatory diagram of a process of the method for manufacturing the multilayer wiring board with a built-in electronic component illustrated in FIG. 1;

FIG. 5K illustrates an explanatory diagram of a process of the method for manufacturing the multilayer wiring board with a built-in electronic component illustrated in FIG. 1;

DETAILED DESCRIPTION OF THE EMBODIMENTS

Figure 1:
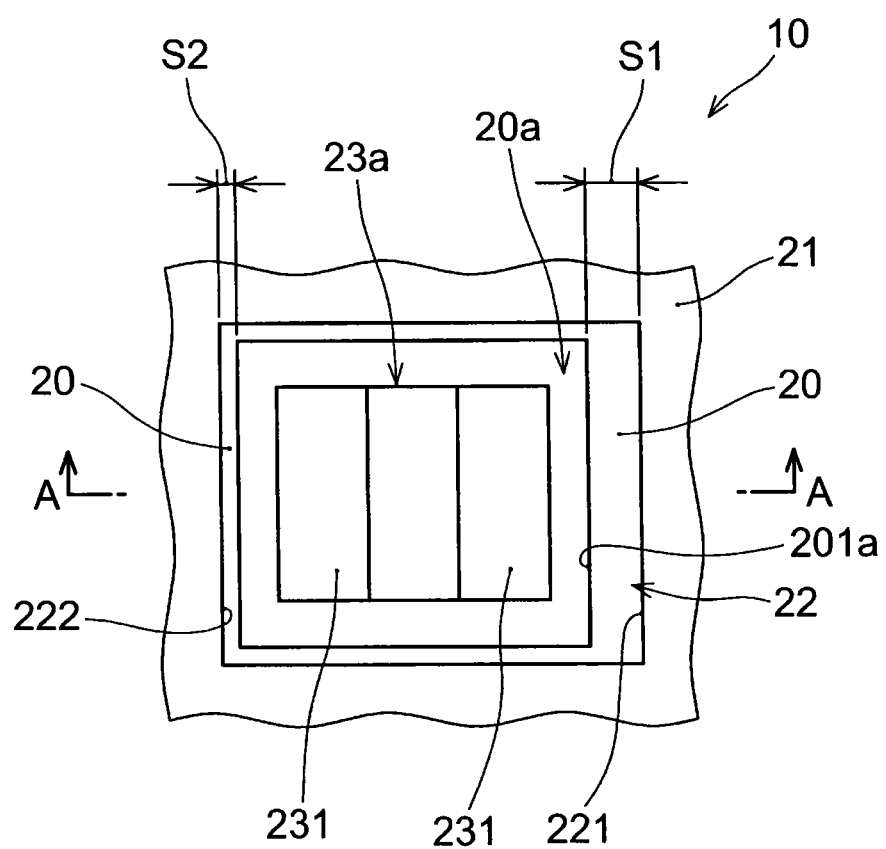
FIG. 1 illustrates a plan view of a cavity, in which an electronic component is built, in a multilayer wiring board with a built-in electronic component of an embodiment of the present invention.

The embodiments will now be described with reference to the accompanying drawings, wherein like reference numerals designate corresponding or identical elements throughout the various drawings.

A multilayer wiring board with a built-in electronic component of an embodiment of the present invention is described with reference to the drawings. In the following description, a layer close to a substrate of the multilayer wiring board with a built-in electronic component of the embodiment of the present invention is referred to as a lower layer or an inner layer, and a layer far away from the substrate is referred to as an upper layer or an outer later.

Figure 2:
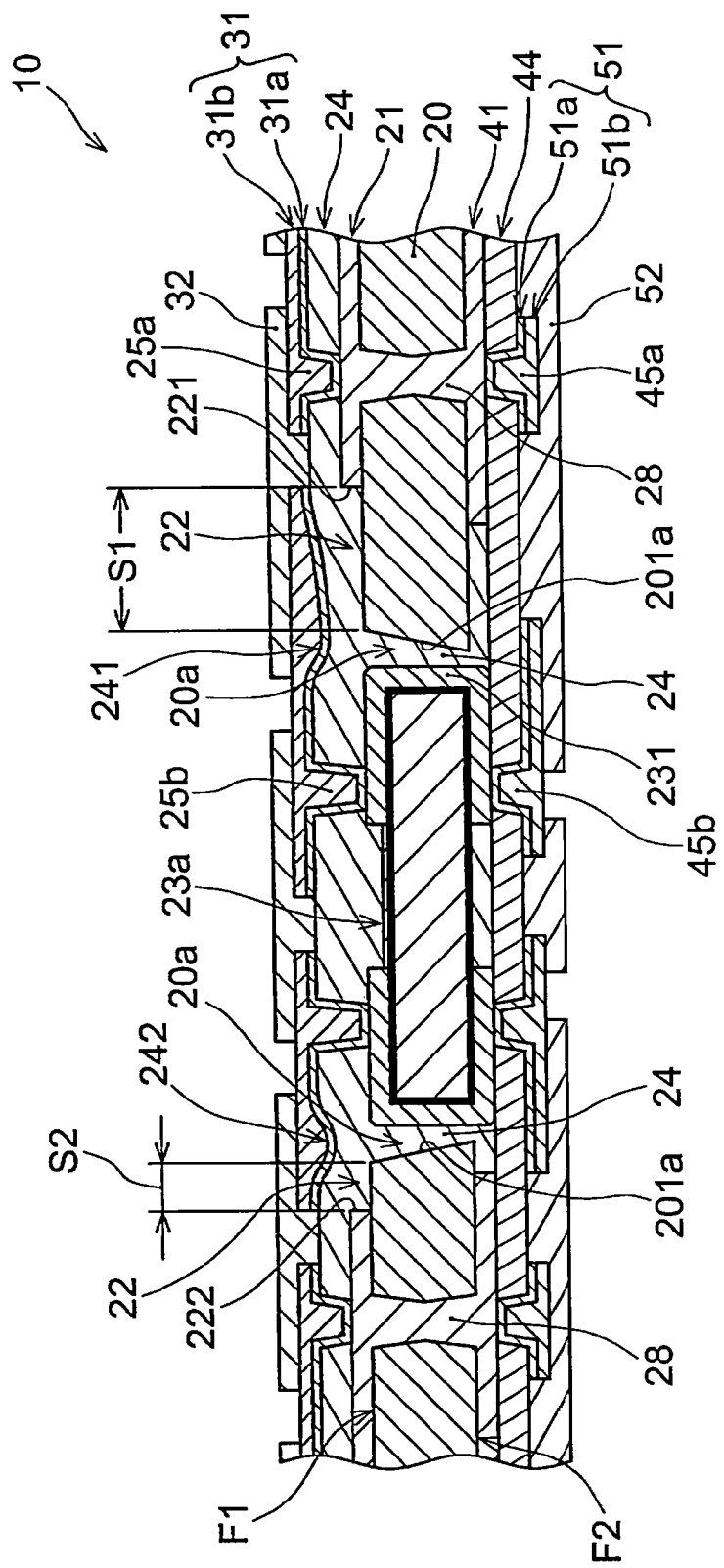
FIG. 2 illustrates a cross-sectional view along a line A-A in FIG. 1.

As illustrated in FIGS. 1 and 2, a multilayer wiring board 10 with a built-in electronic component of the present embodiment (hereinafter, the multilayer wiring board with a built-in electronic component is simply referred to as a "wiring board") includes an opening part 22 that is provided by removing a rectangular portion of a conductor layer 21 that is formed on a first surface (F1) of a substrate 20, a cavity (20a) that is formed in a rectangular planar shape and penetrates through the substrate 20 that is exposed from the opening part 22, an electronic component (23a) that is built in the cavity (20a), an insulating layer 24 that is laminated around and on the electronic component (23a) and on the substrate 20, and a wiring layer 31 that is formed on the insulating layer 24. In the present embodiment, as illustrated in FIG. 2, the wiring layer 31 is formed by an electroless plating film (31a) that is formed on the insulating layer 24 and an electroplating film (31b) that is formed on the electroless plating film (31a). FIG. 1 illustrates a state before the insulating layer 24 is laminated. Further, in the present embodiment, as illustrated in FIG. 2, an inner wall surface (201a) of the cavity (20a) is formed as a tapered surface and thus can be illustrated as a surface in a plan view illustrated in FIG. 1 and the like. However, this is omitted in FIGS. 1 and 3A-3C for clarity of each of the plan views.

As illustrated in FIG. 1, in the present embodiment, a width (S1) of the substrate 20 that is exposed between the cavity (20a) and the conductor layer 21 on a first side 221 side of the opening part 22 of the conductor layer 21 (hereinafter, "the width (S1) of the substrate 20 that is exposed between the cavity (20a) and the conductor layer 21 on the first side 221 side of the opening part 22 of the conductor layer 21" is simply referred to as "the width (S1) of the substrate 20 on the first side 221 side") is wider than a width (S2) of the substrate 20 that is exposed between the cavity (20a) and the conductor layer 21 on a second side 222 side that opposes the first side 221 side of the opening part 22 of the conductor layer 21 (hereinafter, "the width (S2) of the substrate 20 that is exposed between the cavity (20a) and the conductor layer 21 on the second side 222 side of the opening part 22 of the conductor layer 21" is simply referred to as "the width (S2) of the substrate 20 on the second side 222 side"). As illustrated in FIG. 2, recesses 241, 242 are formed on a surface of the insulating layer 24 between the electronic component (23a) and the inner wall surface (201a) of the cavity (20a). However, as described above, the width (S1) of the substrate 20 on the first side 221 side is formed to be wider than the width (S2) of the substrate 20 on the second side 222 side. Therefore, the recess 241 on the first side 221 side of the opening part 22 has a gentler slope than the recess 242 on the second side 222 side.

In other words, in the present embodiment, as illustrated in FIG. 1, the cavity (20a) in the opening part 22 of the conductor layer 21 is provided to be positioned closer to the second side 222 side rather than at a center of the opening part 22 so that the width (S1) of the substrate 20 on the first side 221 side is wider than the width (S2) of the substrate 20 on the second side 222 side. On the other hand, the electronic component (23a) is arranged near a center of the cavity (20a), and, as illustrated in FIG. 2, the insulating layer 24 becomes thicker at places where the electronic component (23a) is not arranged in the cavity (20a), that is, in clearance gaps between the electronic component (23a) and the inner wall surface (201a) of the cavity (20a), than on the electronic component (23a) and on the conductor layer 21. The insulating layer 24 tends to shrink when cured by heating, and an amount of the shrinkage is larger for a thicker portion of the insulating layer. Therefore, on the surface of the insulating layer 24, the recesses (241, 242) with bottom parts near the clearance gaps between the electronic component (23a) and the inner wall surface (201a) of the cavity (20a) are likely to occur. As can be understood from FIG. 6 in which an enlarged view of the recess 241 is illustrated, the slope of the recess is gentler when a distance is longer from an edge (wall surface of the opening part 22) of the conductor layer 21 that is at a highest position in a portion where the insulating layer 24 is laminated to a portion where the recess 241 occurs, that is to a portion of the clearance gap between the electronic component (23a) and the inner wall surface (201a) of the cavity (20a). In the present embodiment, as described above, the cavity (20a) is provided to be positioned closer to the second side 222 side rather than at the center of the opening part 22. As a result, a distance from the inner wall surface (201a) of the cavity (20a) to the conductor layer 21 on the first side 221 side, that is, the width (S1) of the substrate 20 on the first side 221 side is wider than a distance from the inner wall surface (201a) of the cavity (20a) to the conductor layer 21 on the second side 222 side, that is, the width (S2) of the substrate 20 on the second side 222 side. Therefore, the slope of the recess 241 on the first side 221 side is gentler than the slope of the recess 242 on the second side 222 side.

Figure 5C:
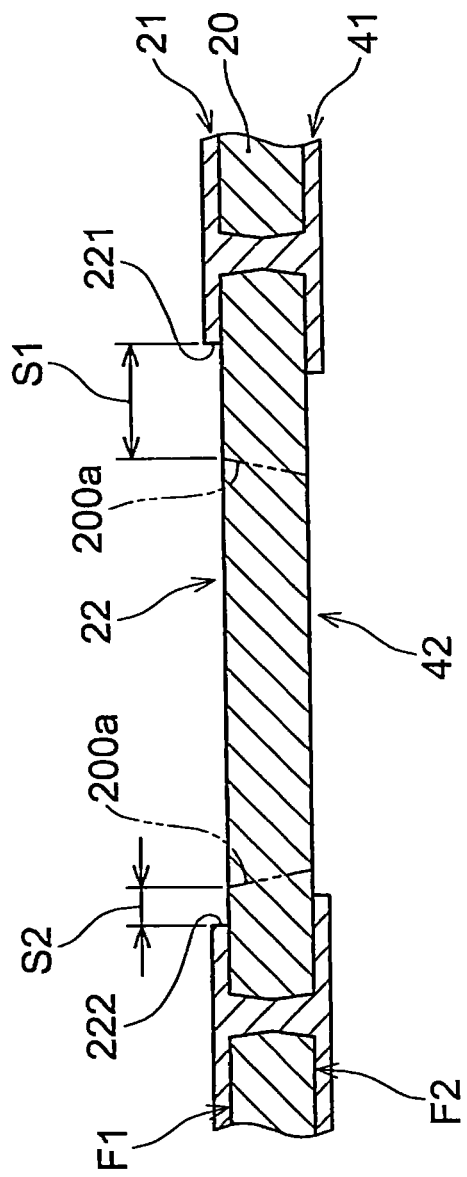
FIG. 5C illustrates an explanatory diagram of a process of the method for manufacturing the multilayer wiring board with a built-in electronic component illustrated in FIG. 1.

In this way, when the recess 241 on the surface of the insulating layer 24 has a gentle slope, in a patterning process of the wiring layer 31 in a manufacturing process of the wiring board 10, a void is unlikely to occur between the electroless plating film (31a) and a resist pattern formation film 71 that is laminated on the electroless plating film (31a) (see FIG. 5I; hereinafter, the resist pattern formation film is simply referred to as a resist film). In the following, a lamination process of the resist film 71 in the patterning process of the wiring layer 31 is described. The overall manufacturing process of the wiring board 10 will be described later. In the patterning process of the wiring layer 31 of the present embodiment, as illustrated in FIG. 5I, the electroless plating film (31a) is formed on the insulating layer 24 that is formed on the first surface (F1) side of the substrate 20, and the resist film 71 for masking a portion where the electroplating film (31b) (see FIG. 2) is not to be formed is laminated on the electroless plating film (31a). A common photosensitive dry film is used for the resist film 71. However, without being limited to this, a non-photosensitive resist film or the like may also be used.

Figure 7:
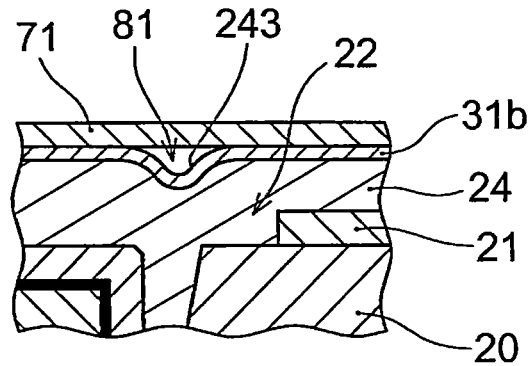
FIG. 7 illustrates a cross-sectional view illustrating a void that occurs in a manufacturing process of a conventional multilayer wiring board with a built-in electronic component.

The resist film 71 is, preferably, successively laminated from one side toward the other side of the substrate 20 while being pressed by a roller (not illustrated in the drawings) or the like at an appropriate temperature so that air does not get into between the resist film 71 and the electroless plating film (31a) to cause a void to occur. Further, even when a surface of the electroless plating film (31a) is uneven to some extent, the resist film 71 is formed to be flexible so as to be capable of being laminated to follow the unevenness of the surface of the electroless plating film (31a). However, as illustrated in FIG. 7, when there is a recess 243 with a steep slope on a surface on which the resist film 71 is laminated, it is possible that the resist film 71 cannot follow the shape of the recess 243 and air is caused to get into the recess 243. As a result, a void 81 occurs between the electroless plating film (31a) and the resist film 71. However, in the present embodiment, the recess 241 that occurs on the first side 221 side of the opening part 22 of the conductor layer 21 has a gentle slope and thus such a void 81 is unlikely to occur.

As illustrated in FIG. 2, the recesses on the surface of the insulating layer 24 can occur on both the first side 221 side and the second side 222 side of the opening part 22 of the conductor layer 21. However, even when recesses having slopes of about the same degree occur on both the first side 221 side and the second side 222 side, there is a tendency that a void is unlikely to occur on a recess on a side where the resist film 71 is laminated first when the resist film 71 is successively laminated from one side of the wiring board 10. A reason for this may be as follows. In a lamination direction of the resist film 71, the surface wall of the opening part 22 of the conductor layer 21 is immediately behind the recess on the side where the resist film 71 is laminated later, whereas there is no surface wall behind the recess on the side where the resist film 71 is laminated first and thus it is easy for air to escape and, as a result, a void is unlikely to occur. In view of this point, widening the width of the substrate 20 on only one side rather than on both sides of the opening part 22 of the conductor layer 21 can effectively suppress disconnection or short circuit in a conductor pattern without increasing the opening part 22 of the conductor layer 21 to a size more than necessary, and thus is preferable. In the present embodiment, only the width (S1) of the substrate 20 on the first side 221 side is widened. As a result, the width (S1) of the substrate 20 on the first side 221 side is greater than the width (S2) of the substrate 20 on the second side 222 side. In the patterning process of the wiring layer 31 of the wiring board 10 of the present embodiment, it is preferable that the resist film 71 be successively laminated from the second side 222 side to the first side 221 side.

The wider the width (S1) of the substrate 20 on the first side 221 side is, the gentler the slope of the recess 241 becomes and, as a result, it becomes less likely for a void to occur between the resist film 71 and the electroless plating film (31a). Although this is preferable, when the width is widened to a certain extent or more, the void suppression effect becomes saturated and only the size of the opening part 22 of the conductor layer 21 is increased. Therefore, a ratio (S1/S2) between the width (S1) of the substrate 20 on the first side 221 side and the width (S2) of the substrate 20 on the second side 222 side is preferably greater than 1.0 and less than 4.0, and more preferably greater than 2.0.

Figure 6:
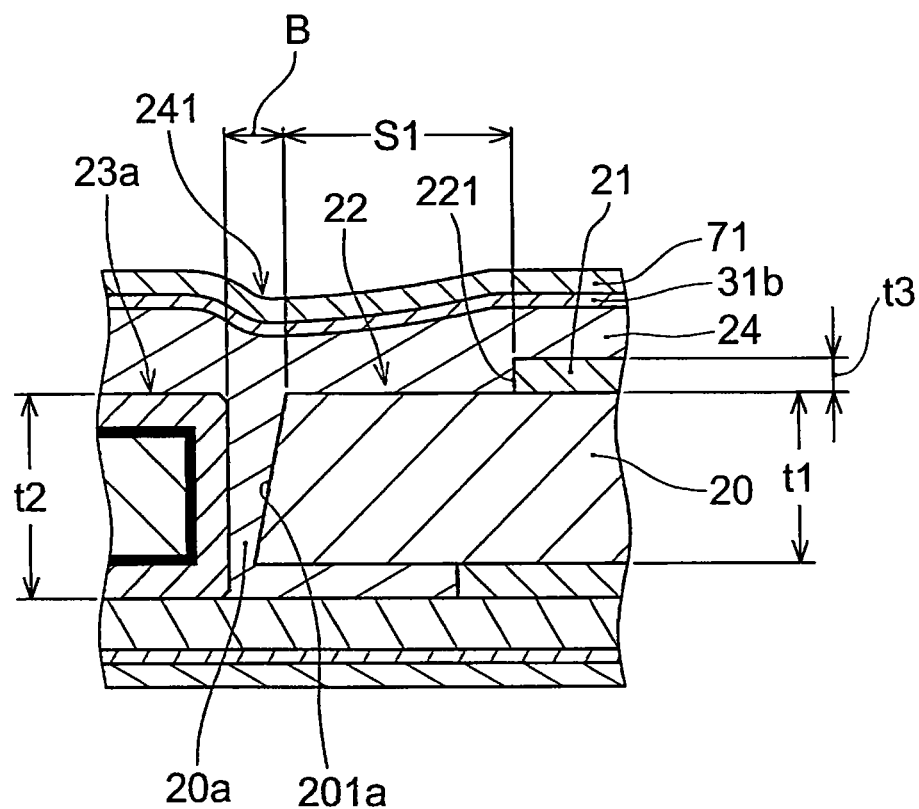
FIG. 6 illustrates a cross-sectional view illustrating a resist pattern formation film that is laminated to follow a recess on a surface of an insulating layer in a manufacturing process of the multilayer wiring board with a built-in electronic component illustrated in FIG. 1.

A preferred value of an absolute value of the width (S1) of the substrate 20 on the first side 221 side can vary depending on dimensions of respective parts that are indicated by t1-t3 and B in FIG. 6. The dimensions of these parts can generally be as follows: the thickness (t1) of the substrate 20 is 100-600 mm; the thickness (t2) of the electronic component (23a) is 80-600 mm; the thickness (t3) of the conductor layer 21 is 5-40 mm; and the distance (B) between the electronic component (23a) and the inner wall (201a) of the cavity (20a) is 30-150 mm. In such a case, it is preferable that the absolute value of the width (S1) of the substrate 20 on the first side 221 side be equal to or greater than the distance (B) between the electronic component (23a) and the inner wall (201a) of the cavity (20a) and be equal to or less than the thickness (t1) of the substrate 20 and the thickness (t2) of the electronic component (23a). That is, it is preferable that the width (S1) be within a range of 30-600 mm.

Figure 3A:
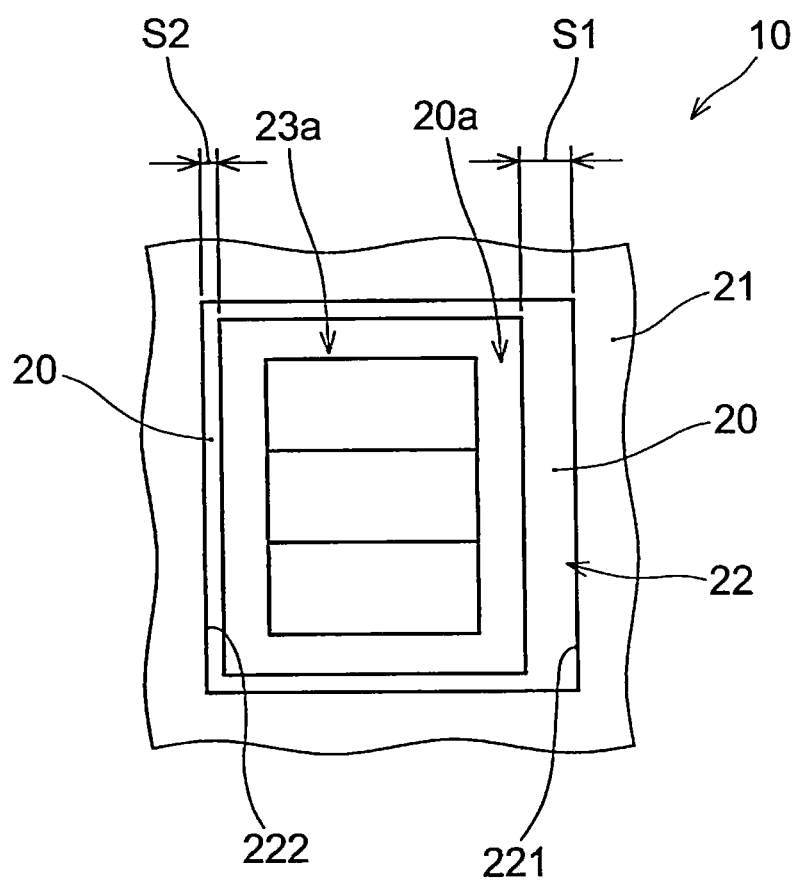
FIG. 3A illustrates a plan view of a modified embodiment of the multilayer wiring board with a built-in electronic component illustrated in FIG. 1.

In the example illustrated in FIG. 1, on the first side 221 and the second side 222 that are parallel to a lateral direction of the opening part 22 of the conductor layer 21, the width (S1) of the substrate 20 on the first side 221 side is formed to be greater than the width (S2) of the substrate 20 on the second side 222 side. However, the first side 221 and the second side 222 are not limited to such a structure. For example, as illustrated in FIG. 3A, it is also possible that the first side 221 and the second side 222 are sides parallel to a longitudinal direction of the opening part 22. In the example illustrated in FIG. 3A, the cavity (20a) is formed with a longitudinal direction of a rectangular planar shape thereof aligned with the longitudinal direction of the opening part 22 of the conductor layer 21 provided in a rectangular planar shape, and the electronic component (23a) of a rectangular planar shape is arranged with its longitudinal direction aligned with that of the cavity (20a). On the first side 221 and the second side 222 that are parallel to the longitudinal direction of the opening part 22, the width (S1) of the substrate 20 on the first side 221 side is formed to be greater than the width (S2) of the substrate 20 on the second side 222 side.

The opening part 22 of the conductor layer 21 and the cavity (20a) are not limited to be formed in rectangular shapes, but may be formed in any shapes. However, it is preferable that the opening part 22 and the cavity (20a) be formed in shapes that each have two sides that are parallel to and opposing each other, such as a rectangular shape, a track shape, a shape of a regular polygon that has an even number of sides, and the opening part 22 and the cavity (20a) be formed in substantially the same shape.

Figure 3B:
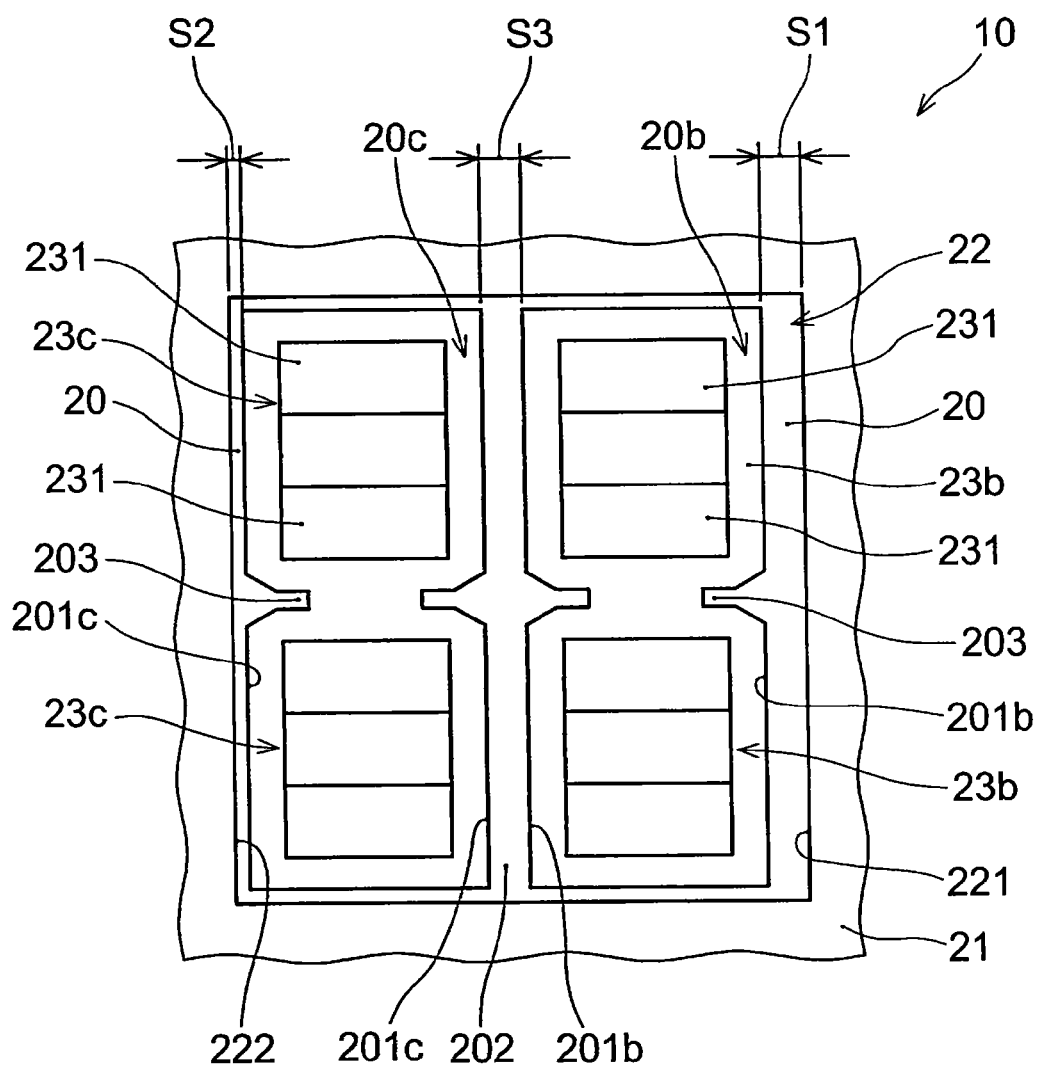
FIG. 3B illustrates a plan view of another modified embodiment of the multilayer wiring board with a built-in electronic component illustrated in FIG. 1.

In the example illustrated in FIG. 1, the one cavity (20a) is formed in the one opening part 22 of the conductor layer 21, and the one electronic component (23a) only is arranged in the one cavity (20a). However, the number of cavities and the number of electronic components are not limited to one. As illustrated in FIG. 3B, it is also possible that multiple cavities are formed in the one opening part 22, and multiple electronic components are arranged in one cavity. In the example illustrated in FIG. 3B, in the opening part 22 that is provided in the conductor layer 21, two cavities (20b, 20c) that each have a substantially rectangular shape as a whole are formed with their longitudinal directions aligned and arranged side by side in the lateral direction with a portion of the substrate 20, on which the conductor layer 21 is removed, as a partition wall 202. Two electronic components (23b) each having a substantially rectangular shape are arranged side by side in the cavity (20b) along the longitudinal direction of the cavity (20b) with longitudinal directions of the electronic components aligned with the longitudinal direction of the cavity (20b). Similarly, two electronic components (23c) each having a substantially rectangular shape are arranged side by side in the cavity (20c) along the longitudinal direction of the cavity (20c) with longitudinal directions of the electronic components aligned with the longitudinal direction of the cavity (20c). On each of the inner wall surfaces (201b, 201c) of the cavity (20b) and the cavity (20c), projections 203 are integrally formed with the substrate 20, the projections extending between the electronic components (23b) or between the electronic components (23c). Due to the projections 203, positional displacements of the electronic components (23b) in a direction in which they approach each other, and positional displacements of the electronic components (23c) in a direction in which they approach each other, are prevented. The width (S1) of the substrate 20 on the first side 221 side is formed to be greater than the width (S2) of the substrate 20 on the second side 222 side that opposes the first side 221 side. Therefore, similar to the example illustrated in FIG. 1, in the manufacturing process of the wiring board 10, a void is unlikely to occur between the resist film 71 (see FIG. 5I) and the electroless plating film (31a). As a result, disconnection or short circuit in a conductor pattern formed in the wiring layer 31 is unlikely to occur. It is preferable that the partition wall 202 be formed to have a width (S3) greater than the width (S2) of the substrate 20 on the second side 222 side. The width (S3) of the partition wall 202 may be wider or narrower than or the same as the width (S1) of the substrate 20 on the first side 221 side.

In the example illustrated in FIG. 3B, the two electronic components (23b) arranged in the cavity (20b) and the two electronic components (23c) arranged in the cavity (20c) are arranged with their longitudinal directions aligned. However, the arrangement directions of the electronic components (23b) and the electronic components (23c) are not limited to this. For example, as illustrated in FIG. 3C, the electronic components (23b) arranged in the cavity (20b) and the electronic components (23c) arranged in the cavity (20c) may be arranged in different orientations. In the example illustrated in FIG. 3C, in the one opening part 22 of the conductor layer 21, the cavities (20b, 20c) each having a substantially rectangular planar shape are formed and arranged with a portion of the substrate 20 as the partition wall 202. In the cavity (20b), the two electronic components (23b) each having a substantially rectangular shape are arranged with their longitudinal directions aligned with a direction parallel to a length direction of the partition wall 202. Further, in the cavity (20c), the two electronic components (23c) each having a substantially rectangular shape are arranged with their longitudinal directions aligned with a direction orthogonal to the length direction of the partition wall 202. That is, the electronic components (23b) and the electronic components (23c) are respectively arranged in directions orthogonal to each other. Further, on the inner wall surfaces (201b, 201c) of the cavity (20b) and the cavity (20c), similar to FIG. 3B, the projections 203 are integrally formed with the substrate 20 to prevent positional displacements of the electronic components (23b) and the electronic components (23c). The width (S1) of the substrate 20 on the first side 221 side is formed to be wider than the width (S2) of the substrate 20 on the second side 222 side that opposes the first side 221 side. Therefore, similar to the example illustrated in FIG. 1, in the manufacturing process of the wiring board 10, a void is unlikely to occur between the resist film 71 (see FIG. 5I) and the electroless plating film (31a). As a result, disconnection or short circuit in a conductor pattern formed in the wiring layer 31 is unlikely to occur.

As illustrated in FIG. 2, in the wiring board 10 of the present embodiment, in addition to the conductor layer 21, the insulating layer 24 and the wiring layer 31, other structure elements may also be included. For example, a solder resist 32 is formed on the wiring layer 31. In the insulating layer 24, via conductors (25a) that connect the conductor layer 21 and the wiring layer 31 and via conductors (25b) that connect electrodes 231 of the electronic components (23a) and the wiring layer 31 are provided. Further, similar to the first surface (F1) side of the substrate 20, a second conductor layer 41 is provided on a surface (second surface) (F2) that is on an opposite side of the first surface (F1). On the second conductor layer 41, a second insulating layer 44, an electroless plating film (51a) and an electroplating film (51b) are sequentially formed, the electroless plating film (51a) and the electroplating film (51b) forming a second wiring layer 51. Further, a solder resist 52 is formed on the second wiring layer 51. In the second insulating layer 44, via conductors (45a) that connect the second conductor layer 41 and the second wiring layer 51 and via conductors (45b) that connect the electrodes 231 of the electronic component (23a) and the second wiring layer 51 are provided. Further, through-hole conductors 28 are provided in the substrate 20. The conductor layer 21 and the second conductor layer 41 are connected by the through-hole conductors 28.

In the present embodiment, the substrate 20 is formed from an insulating material that is formed by impregnating a core material such as a glass cloth with an epoxy resin (hereinafter, such an insulating material is referred to as a glass epoxy). However, the substrate 20 may also be formed using any insulating material other than the glass epoxy.

The insulating layer 24 and the second insulating layer 44 are formed using an epoxy resin that contains an inorganic filler and that does not contain a glass cloth. However, the material of the insulating layer 24 and the second insulating layer 44 is not limited to this. For example, other than the epoxy resin, a bismaleimide triazine resin (BT resin), an imide resin (polyimide), and the like, may also be used. Further, the material of the insulating layer 24 and the second insulating layer 44 may also contain a core material such as a glass cloth, and the above-described glass epoxy and the like may also be used. In the present embodiment, surroundings of the electronic components (23a-23c) are completely covered by the insulating layer 24 and the second insulating layer 44. As a result, the electronic components (23a-23c) are protected and are fixed at predetermined positions in the cavities (20a-20c).

In the present embodiment, the electronic components (23a-23c) are respectively chip type capacitors. As illustrated in FIG. 1 or FIG. 3B, the electronic components (23a-23c) are each formed in a substantially rectangular planar shape and each have the electrodes 231 respectively provided on two end parts thereof in the longitudinal direction. The electronic components (23a-23c) are not limited to capacitors as in the present embodiment, but any other electronic components may also be used. For example, the electronic components (23a-23c) may also be chip type inductors, resistors or semiconductor devices in a bare chip state. Further, the electronic components (23a-23c) may also be mutually different kinds of electronic components. Further, different kinds of electronic components may be mixed in any one of the cavities (20a-20c).

The via conductors (25a, 25b, 45a, 45b) and through-hole conductors 28 are preferably formed by plating and, for example, may each contain any one or both of an electroless plating film and an electroplating film. Materials for the respective via conductors and the through-hole conductors are not particularly limited, but copper is preferably used. The via conductors (25a, 25b, 45a, 45b) and the through-hole conductors 28 may each be a filled conductor or a conformal conductor.

In the present embodiment, the conductor layer 21 and the second conductor layer 41 are formed by a copper foil and an electroless plating film and an electrolytic plating film that are formed on the copper foil. However, the structures of the respective conductor layers are not limited to these. For example, it is also possible that a copper foil or an electroplating film is not included. Further, copper is preferably used as a material for each of the conductor layers. However, other conductive materials may also be used as materials of the respective conductor layers.

Next, a method for manufacturing the wiring board 10 of the present embodiment illustrated in FIG. 1 is described with reference to FIGS. 4 and 5A-5K. First, at a step indicated by S11 in FIG. 4, the through-hole conductors 28 are formed in the substrate 20. Specifically, as illustrated in FIG. 5A, as a starting material, a double-sided copper-clad laminated plate 15 is prepared that is obtained by providing a copper foil (21a) on both sides of the substrate 20. In the present embodiment, the substrate 20 is formed from the glass epoxy in a fully cured state.

Next, as illustrated in FIG. 5B, for example, $CO_2$ laser is used to irradiate laser light onto the same positions on the double-sided copper-clad laminated plate 15 from both the first surface (F1) side and the second surface (F2) side of the substrate 20. As a result, through holes 281 are formed. After the formation of the through holes 281, preferably, desmear can be performed with respect to the through holes 281. Further, in order to improve laser absorption efficiency, a surface of the copper foil (21a) may be subjected to a blackening treatment before the laser irradiation. Further, the through holes 281 may also be formed using a method other than laser processing, such as using a drill or etching. However, since it facilitates fine processing, laser processing is preferably used.

Next, for example, a copper plating film (21b) is formed on the copper foil (21a) and in the through holes 281 using, for example, a panel plating method. Specifically, first, electroless plating is performed. Next, electroplating is performed using the electroless plating film as a seed layer. Thereby, the plating film (21b) that includes the electroless plating film and the electroplating film is formed. As a result, the through holes 281 are filled by the plating film 222 and the through-hole conductors 28 are formed. Further, the conductor layer 21 and the second conductor layer 41, which include the copper foil (21a) and the plating film (21b), are formed.

Figure 4:
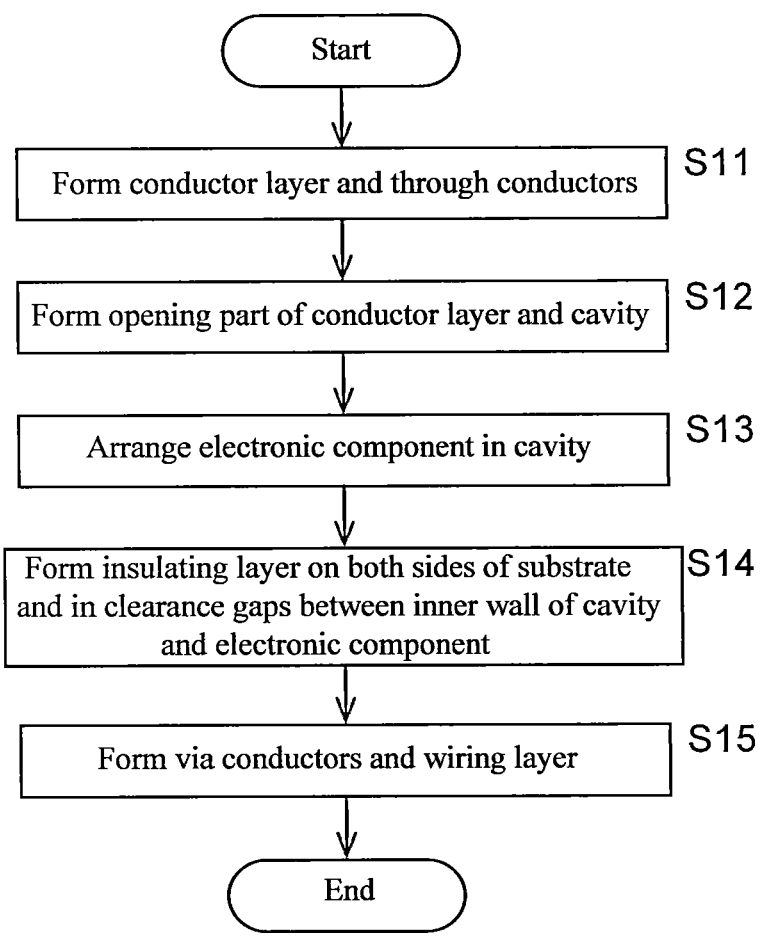
FIG. 4 illustrates a flowchart of a method for manufacturing the multilayer wiring board with a built-in electronic component illustrated in FIG. 1.

Next, at a step indicated by S12 in FIG. 4, the conductor layer 21 and the second conductor layer 41 are patterned. Specifically, first, a region where the conductor pattern of the conductor layer 21 is provided is covered by an etching resist film. Similarly, a region where a conductor pattern of the second conductor layer 41 on the second surface (F2) side is provided is also covered by an etching resist film. Then, portions of the plating film (21b) and the copper foil (21a) that are not covered by the etching resist films (portions exposed from opening parts of the etching resist films) are removed. As a result, as illustrated in FIG. 5C, the conductor layer 21 and the second conductor layer 41 having their predetermined regions removed are respectively formed on the first surface (F1) and the second surface (F2) of the substrate 20. The conductor layer 21 and the second conductor layer 41 are each illustrated as one layer in each of the drawings. However, in the present embodiment, specifically, the conductor layer 21 and the second conductor layer 41 are each formed from three layers including, for example, a copper foil (lower layer), an electroless copper plating layer (middle layer) and an electrolytic copper plating layer (upper layer).

Figure 5D:
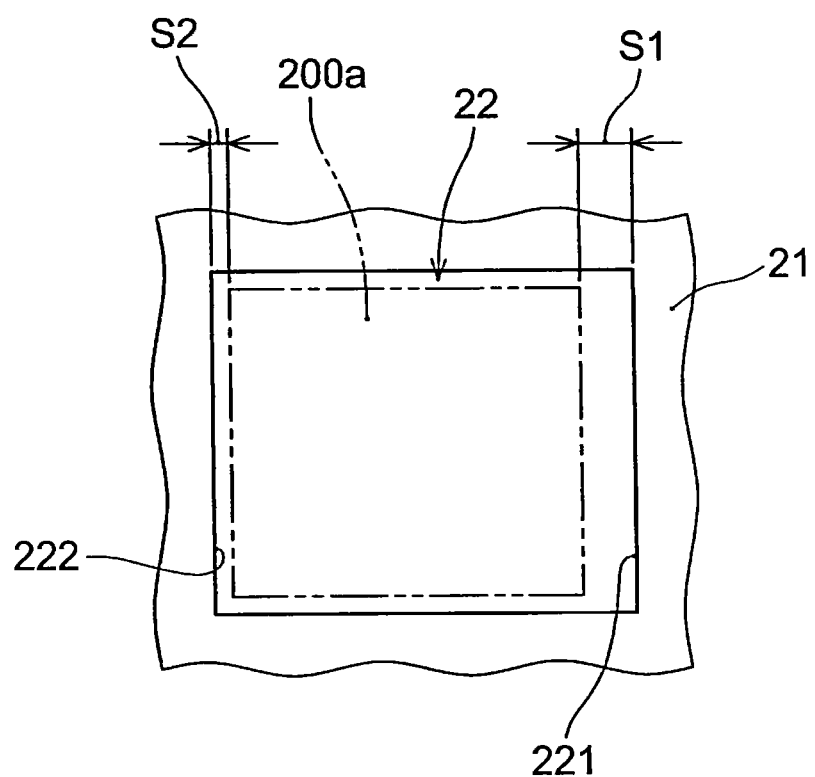
FIG. 5D illustrates an explanatory diagram of a process of the method for manufacturing the multilayer wiring board with a built-in electronic component illustrated in FIG. 1.
Figure 5H:
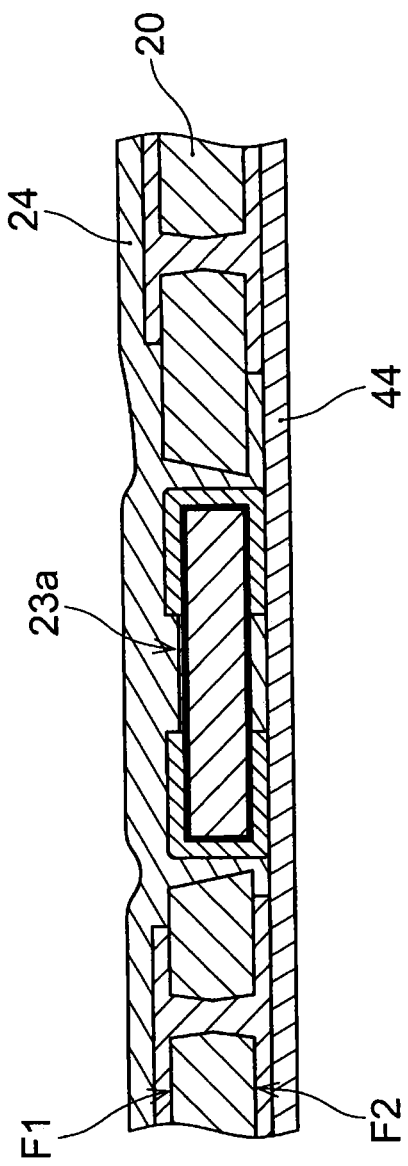
FIG. 5H illustrates an explanatory diagram of a process of the method for manufacturing the multilayer wiring board with a built-in electronic component illustrated in FIG. 1.
Figure 5I:
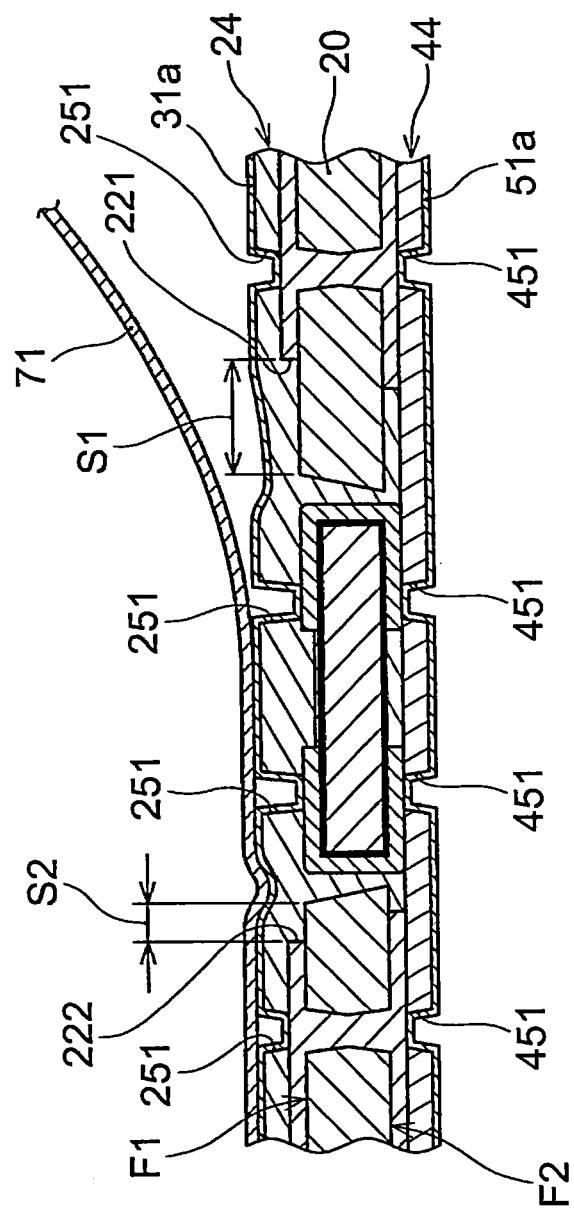
FIG. 5I illustrates an explanatory diagram of a process of the method for manufacturing the multilayer wiring board with a built-in electronic component illustrated in FIG. 1.

In the present embodiment, in the patterning process of the conductor layer 21, as illustrated in FIGS. 5C and 5D, by removing a portion of the conductor layer 21, the opening part 22 having the first side 221 and the second side 222 that opposes the first side 221 is provided. Here, as illustrated in FIGS. 5C and 5D, the opening part 22 is provided such that a region (200a) where the cavity (20a) is provided in a process to be described later is positioned closer to the second side 222 side in the opening part 22. By providing such an opening part 22, when the cavity (20a) is provided, the width (S1) of the substrate 20 on the first side 221 side is wider than the width (S2) of the substrate 20 on the second side 222 side. In the present embodiment, as illustrated in FIG. 5C, an opening part 42 is also similarly formed on the second surface (F2) of the substrate 20 by removing a portion of the second conductor layer 41. In the present embodiment, as will be described later, the inner wall surface (201a) (see FIG. 5E) of the cavity (20a) (see FIG. 5E) is formed as a tapered surface that tapers inwardly in the cavity (20a) from the first surface (F1) side to the second surface (F2) side of the substrate 20. Therefore, the region where the cavity (20a) is provided is smaller on the second surface (F2) side than on the first surface (F1) side. Accordingly, in the present embodiment, the opening part 42 of the second conductor layer 41 is smaller than the opening part 22 of the conductor layer 21. By doing so, a larger region where a conductor pattern can be provided can be ensured in the second conductor layer and thus a degree of freedom in pattern design for the wiring board 10 is improved.

Next, the cavity (20a) is provided in the substrate 20. Specifically, for example, along a contour of the region (200a) where the cavity (20a) is provided, the contour being illustrated by a two-dot chain line in FIG. 5D, laser light is irradiated from the first surface (F1) side of the substrate 20 and a region corresponding to the cavity (20a) is cut out from the substrate 20. As a result, as illustrated in FIG. 5E, the cavity (20a) is provided in the substrate 20. In the present embodiment, the cavity (20a) is provided to be closer to the second side 222 side of the opening part 22 rather than centers of the opening part 22 of the conductor layer 21 and opening part 42 of the second conductor layer 41. As a result, the width (S1) of the substrate 20 on the first side 221 side is wider than the width (S2) of the substrate 20 on the second side 222 side. As illustrated in FIGS. 3B and 3C, when the cavities (20b, 20c) are provided using a portion of the substrate 20 as the partition wall 202, and/or when the projections 203 are provided on the inner wall surfaces (201a-201c) of the cavities (20a-20c), predetermined regions are cut out from the substrate 20 according to the respective shapes. In the present embodiment, laser light is irradiated from the first surface (F1) side of the substrate 20. Therefore, an amount of processing by laser is less on the second surface (F2) side than on the first surface (F1) side. Therefore, as illustrated in FIG. 5E, the inner wall surface (201a) of the cavity (20a) is formed as a tapered surface that tapers inwardly in the cavity (20a) from the first surface (F1) side to the second surface (F2) side. A method for providing the cavity (20a) is not limited to a method in which laser is used. For example, the cavity (20a) may also be provided by drill grinding, or may be punched using a die or the like.

Next, at a step indicated by S13 in FIG. 4, the electronic component (23a) is arranged in the cavity (20a). Specifically, first, for example, a carrier 61 that is formed from PET (polyethylene terephthalate) is affixed to the second surface (F2) of the substrate 20. As a result, as illustrated in FIG. 5F, an opening of on one side of the cavity (20a) is closed by the carrier 61. In the present embodiment, the carrier 61 is formed from an adhesive sheet (for example, a tape) having adhesiveness on one side and, for example, the side with adhesiveness is bonded to the substrate 20. Next, as illustrated in FIG. 5F, the electronic component (23a) is picked up by a nozzle (not illustrated in the drawings) of a component mounter and is placed on the carrier 61 in the cavity (20a).

Next, at a step indicated by S14 in FIG. 4, the insulating layer 24 is formed on the first and second surfaces (F1, F2) of the substrate 20 and in the cavity (20a). Specifically, first, the insulating layer 24 in a semi-cured state is arranged on the first surface (F1) of the substrate 20 and on the electronic component (23a) as illustrated in FIG. 5G, and is subsequently pressed in a thickness direction of the substrate 20. As a result, insulating resin that flows out from the insulating layer 24 flows into the cavity (20a). As a result, as illustrated in FIG. 5G, regions between the electronic component (23a) in the cavity (20a) and the substrate 20 are filled with the insulating resin that flows out from the insulating layer 24, and the insulating layer 24 is also formed in these regions.

Next, the insulating layer 24 in the cavity (20a) and the electronic component (23a) are temporarily welded to each other. Specifically, the resin that forms the insulating layer 24 is heated so as to exhibit adhesiveness of an extent enough to support the electronic component (23a). As a result, the electronic component (23a) is supported by the insulating layer 24. Thereafter, the carrier 61 is removed. As illustrated in FIG. 5G, the recesses (241, 242) may occur on portions of the surface of the insulating layer 24 between the electronic component (23a) and the inner wall (201a) of the cavity (20a). At this stage, the insulating layer 24 is only semi-cured, not fully cured. However, without being limited to this, at this point, the insulating layer 24 may also be fully cured.

Next, on the second surface (F2) of the substrate 20, the second insulating layer 44 in a semi-cured state is provided so as to cover the electronic component (23a) and is bonded to the substrate 20 by, for example, pressing. Thereafter, the insulating layer 24 and the second insulating layer 44 are heated and are respectively fully cured. As a result, the fully cured insulating layer 24 and second insulating layer 44 are respectively formed in the surroundings and on upper layer sides of the electronic component (23a) and on upper layer sides of the substrate 20 (see FIG. 5H).

Next, at a step indicated by S15 in FIG. 4, via conductors and a wiring layer are formed. Specifically, first, as illustrated in FIG. 5I, for example, by using laser, via holes 251 are formed in the insulating layer 24, and via holes 451 are formed in the second insulating layer 44. The via holes 251 penetrate through the insulating layer 24, and the via holes 451 penetrate through the second insulating layer 44. Thereafter, preferably, desmear is performed.

Next, by using a chemical plating method, for example, the electroless plating films (31a, 51a) made of copper, for example, are formed on the insulating layer 24, on the second insulating layer 44, in the via holes 251 and in the via holes 451. Prior to the electroless plating, for example, by immersion, a catalyst containing palladium and the like may be adsorbed on surfaces of the insulating layer 24 and the second insulating layer 44. The electroless plating films (31a, 51a) function as seed layers of the electroplating films (31b, 51b) (to be described later). However, the seed layers of the electroplating films (31b, 51b) are not limited to the electroless plating films. For example, a sputtering film or the like may also be used as a seed layer.

Next, as described above, the resist film 71 is laminated on the electroless plating film (31a). In the present embodiment, the width (S1) of the substrate 20 on the first side 221 side is wider than the width (S2) of the substrate 20 on the second side 222 side. Therefore, as described above, the resist film 71 is preferably successively laminated from the second side 222 side to the first side 221 side. Although not illustrated in the drawings, in the present embodiment, a resist film is similarly laminated on the electroless plating film (51a).

Next, the resist film 71 is exposed and developed. As a result, as illustrated in FIG. 5J, mask parts (71a) of a plating resist pattern are formed in regions where a conductor pattern is not formed on the electroless plating film (31a). Similarly, mask parts (71a) are formed in regions where a conductor pattern is not formed on the electroless plating film (51a). In other words, the plating resist patterns are formed having opening parts that expose portions of the electroless plating films (31a, 51a), the portions being where conductor patterns are formed.

Next, the electroplating films (31b, 51b) of copper, for example, are formed using a pattern plating method, for example, in the opening parts of the plating resist patterns, that is, on the portion of the electroless plating films (31a, 51a) where the mask parts (71a) are not formed. As a result, the wiring layer 31 is formed that includes the electroless plating film (31a) and the electroplating film (31b) and in which the electroplating film (31b) is patterned into a predetermined pattern. At the same time, the second wiring layer 51 is formed that includes the electroless plating film (51a) and the electroplating film (51b) and in which the electroplating film (51b) is patterned into a predetermined pattern. Further, along with this, the via holes 251 are filled with the electroplating film (31b) and the via holes 451 are filled with the electroplating film (51b). As a result, the via conductors (25a, 25b, 45a, 45b) are formed.

Thereafter, for example, by using a predetermined peeling solution, the mask parts (71a) of the plating resist patterns are removed. Next, by removing portions of the electroless plating films (31a, 51a) that are exposed by the removal of the mask parts (71a), as illustrated in FIG. 5K, the wiring layer 31 and the second wiring layer 51 are patterned into predetermined patterns.

In the wiring board 10 of the present embodiment, after the patterning of the wiring layer 31 and the second wiring layer 51, as illustrated in FIG. 5K, the solder resists (32, 52) may be formed. Further, a corrosion-resistant layer (not illustrated in the drawings) that is formed from Ni/Au, Ni/Pd/Au, Pd/Au, Sn or the like, for example, may be formed on the wiring layer 31 and on the second wiring layer 51 that are not covered by the solder resists (32, 52). Further, a corrosion-resistant layer that is formed from an organic protective film (OSP) may be formed by immersion in a liquid protective material, spraying a protective material, or the like. Alternately, a solder coating layer (not illustrated in the drawings) may be formed in the opening parts of the solder resists (32, 52) illustrated in FIGS. 2 and 5K. As a result, the wiring board 10 of the present embodiment illustrated in FIGS. 1 and 5K is completed.

For example, as illustrated in FIG. 5K, an external electronic component 100 (for example, an IC chip) may be mounted on the wiring board 10 of the present embodiment. Further, the wiring board 10 may be mounted on another wiring board 200 (for example, a motherboard).

In the present embodiment, the conductor layer and the wiring layer are formed on both sides of the substrate 20 of the wiring board 10. However, without being limited to this, the wiring board 10 may also be a single-sided wiring board in which, for example, an insulating layer and a wiring layer are formed on only one side of the substrate 20. Further, one or more pairs of insulating layers and wiring layers may be further formed on the wiring layer 31 and/or the second wiring layer 51.

Further, the method for manufacturing the wiring board 10 of the present embodiment is not limited to the method described with reference to FIGS. 4 and 5A-5K. The conditions, processing order and the like of the method may be arbitrarily modified. Further, certain steps may be omitted and other steps may be added.

In the wiring board with the electronic component illustrated in Japanese Patent Laid-Open Publication No. 2012-

109610, a material of the insulating layer shrinks when the material is cured. Therefore, a recess is likely to occur on the surface of the insulating layer around the electronic component. Therefore, when a resist pattern formation film is laminated on the wiring layer in a patterning process of the wiring layer that is formed on the insulating layer, a gap (void) may occur between the wiring layer and the film at the recess. When the void exists between the wiring layer and the film, a portion of the wiring layer where the void occurs cannot be normally patterned, and disconnection or short circuit in a conductor pattern may occur.

A multilayer wiring board with a built-in electronic component according to an embodiment of the present invention reduces the occurrence of a void between a resist pattern formation film and a wiring layer when the wiring layer is patterned, the wiring layer being formed on an insulating layer, and reduces the occurrence of disconnection or short circuit in a conductor pattern.

A multilayer wiring board with a built-in electronic component according to an embodiment of the present invention includes: a substrate that has a conductor layer formed on at least one surface thereof; an opening part that is formed by removing a portion of the conductor layer; a cavity that is formed to penetrate through the substrate that is exposed by the opening part; an electronic component that is built in the cavity; an insulating layer that is laminated on the electronic component and on the substrate; and a wiring layer that is formed on the insulating layer. The cavity is formed such that a width (S1) of the substrate that is exposed between the cavity and the conductor layer on a first-side side of the opening part is wider than a width (S2) of the substrate that is exposed between the cavity and the conductor layer on a second-side side that opposes the first-side side of the opening part.

Here, "the first side of the opening part" and "the second side that opposes the first side of the opening part" do not mean only two opposing linear portions on an outer periphery of the opening part, but mean one portion on the outer periphery of the opening part of any planar shape and another portion on the outer periphery at a position opposing the one portion.

A method for manufacturing a multilayer wiring board with a built-in electronic component according to an embodiment of the present invention includes: forming a conductor layer on at least one surface of a substrate; forming an opening part by removing a portion of the conductor layer that has been formed; forming a through hole such that a width of the substrate that is on a first-side side of the opening part is wider than a width of the substrate that is exposed on a second-side side that opposes the first-side side of the opening part; building an electronic component in the through hole; forming an insulating layer on the built-in electronic component and on the substrate; and forming a wiring layer on the insulating layer.

According to an embodiment of the present invention, a slope of a recess that occurs on a surface of the insulating layer around the electronic component is gentler for a recess that occurs on the first-side side of the opening part that is provided by removing a portion of the conductor layer than for a recess that occurs on the second-side side. Therefore, at the recess on the first-side side, it is easy for a resist pattern formation film to follow a shape of the recess. Therefore, a void is unlikely to occur between the film and the conductor layer. As a result, disconnection or short circuit in a conductor pattern is unlikely to occur.

Obviously, numerous modifications and variations of the present invention are possible in light of the above teachings.

It is therefore to be understood that within the scope of the appended claims, the invention may be practiced otherwise than as specifically described herein.

What is claimed is:

1. A multilayer wiring board with a built-in electronic component, comprising: a substrate; a conductor layer formed on a surface of the substrate; at least one electronic component positioned in a cavity formed through the substrate; an insulating layer formed on the substrate such that the insulating layer is formed on the electronic component in the cavity of the substrate; and a wiring layer formed on the insulating layer, wherein the conductor layer has an opening portion formed such that the cavity of the substrate is formed in the opening portion of the conductor layer and that the conductor layer has a first side in the opening portion and a second side in the opening portion on an opposite side across the cavity with respect to the first side, and the cavity is formed in the opening portion of the conductor layer such that a ratio S1/S2 satisfies 1.0<S1/S2<4.0, where S1 represents a width between the cavity and the first side of the conductor layer, and S2 represents a width between the cavity and the second side of the conductor layer.

2. A multilayer wiring board according to claim 1, wherein the substrate has a partition wall extending in the cavity parallel to the first side and second side of the conductor layer such that the partition wall is dividing the cavity into a plurality of cavities.

3. A multilayer wiring board according to claim 2, wherein the partition wall has a width which is greater than the width between the cavity and the second side of the conductor layer and smaller than the width between the cavity and the first side of the conductor layer.

4. A multilayer wiring board according to claim 2, wherein the at least one electronic component comprises a plurality of electronic components such that at least two of the electronic components are positioned in each of the cavities in the substrate.

5. A multilayer wiring board according to claim 2, wherein the substrate has a plurality of projection structures formed in the cavities such that each of the projection structures is positioned between the two electronic components.

6. A multilayer wiring board according to claim 5, wherein each of the cavities has a rectangular shape, the at least one electronic component comprises a plurality of electronic components such that two of the electronic components are positioned in each of the cavities in the substrate and are aligned in a same direction, and the cavities have the electronic components positioned such that one of the cavities has the two electronic components aligned in a first direction and that another one of the cavities has the two electronic components aligned in a second direction orthogonal to the first direction.

7. A multilayer wiring board according to claim 2, wherein each of the cavities has a rectangular shape, the at least one electronic component comprises a plurality of electronic components such that two of the electronic components are positioned in each of the cavities in the substrate and are aligned in a same direction, and the cavities have the electronic components positioned such that one of the cavities has the two electronic components aligned in a first direction and that another one of the cavities has the two electronic components aligned in a second direction orthogonal to the first direction.

8. A multilayer wiring board according to claim 2, further comprising:
an electroless plating film formed on the insulating layer; and a resist film laminated on the electroless plating film and having a resist pattern extending between the first side and second side of the conductor layer such that the wiring layer is formed in the resist pattern.

9. A multilayer wiring board according to claim 1, wherein the at least one electronic component comprises at least two electronic components positioned in the cavity in the substrate.

10. A multilayer wiring board according to claim 1, wherein the substrate has a projection structure formed in the cavity such that the projection portion is positioned between the two electronic components.

11. A multilayer wiring board according to claim 1, wherein the cavity has a rectangular shape, and the at least one electronic component comprises two electronic components positioned in the cavity such that the two electronic components are aligned in a same direction.

12. A multilayer wiring board according to claim 1, further comprising:
an electroless plating film formed on the insulating layer; and
a resist film laminated on the electroless plating film and having a resist pattern extending between the first side and second side of the conductor layer such that the wiring layer is formed in the resist pattern.

13. A multilayer wiring board according to claim 12, wherein the substrate has a partition wall extending in the cavity such that the partition wall is dividing the cavity into a plurality of cavities.

\* \* \* \* \*